(12) United States Patent
Lee

(10) Patent No.: US 6,849,954 B2
(45) Date of Patent: Feb. 1, 2005

(54) IC PACKAGE SUBSTRATE WITH OVER VOLTAGE PROTECTION FUNCTION

(75) Inventor: Chun-Yuan Lee, Hsinchu (TW)

(73) Assignee: Inpaq Technology Co., Ltd., Miao Li Hsien (TW)

(*) Notice: Subject to any disclaimer, the term of this patent is extended or adjusted under 35 U.S.C. 154(b) by 121 days.

(21) Appl. No.: 10/219,514

(22) Filed: Aug. 15, 2002

(65) Prior Publication Data

US 2003/0038345 A1 Feb. 27, 2003

(30) Foreign Application Priority Data

Aug. 24, 2001 (TW) .................................. 90120882 A

(51) Int. Cl.⁷ .............................................. H01L 21/48
(52) U.S. Cl. ...................... 257/778; 257/784; 257/758; 361/313
(58) Field of Search ................................ 257/659, 778, 257/784, 758, 660; 438/108, 617; 361/313

(56) References Cited

U.S. PATENT DOCUMENTS

| | | | |
|---|---|---|---|
| 4,959,505 A | 9/1990 | Ott | |
| 4,993,142 A | 2/1991 | Burke et al. | |
| 5,831,510 A | 11/1998 | Zhang et al. | |
| 5,884,391 A | 3/1999 | McGuire et al. | |
| 6,223,423 B1 | 5/2001 | Hogge | |
| 6,242,997 B1 | 6/2001 | Barrett et al. | |
| 6,285,275 B1 | 9/2001 | Chen et al. | |
| 6,297,722 B1 | 10/2001 | Yeh | |
| 6,429,533 B1 | 8/2002 | Li et al. | |
| 6,498,715 B2 * | 12/2002 | Lee et al. | 361/313 |
| 6,556,123 B1 | 4/2003 | Iwao et al. | |
| 2001/0000658 A1 | 5/2001 | Barrett et al. | |

FOREIGN PATENT DOCUMENTS

JP 9-260106 10/1997

* cited by examiner

Primary Examiner—Nathan J. Flynn
Assistant Examiner—Leonardo Andújar
(74) Attorney, Agent, or Firm—Senniger Powers

(57) ABSTRACT

The present invention relates to an IC package substrate provided with over voltage protection function and thus, a plurality of over voltage protection devices are provided on a single substrate to protect an IC chip directly. According to the present invention, there is no need to install multiple protection devices on a printed circuit board. Therefore, the costs to design circuits are reduced, the limited space is effectively utilized, and unit costs to install respective protection devices are lowered down.

4 Claims, 5 Drawing Sheets

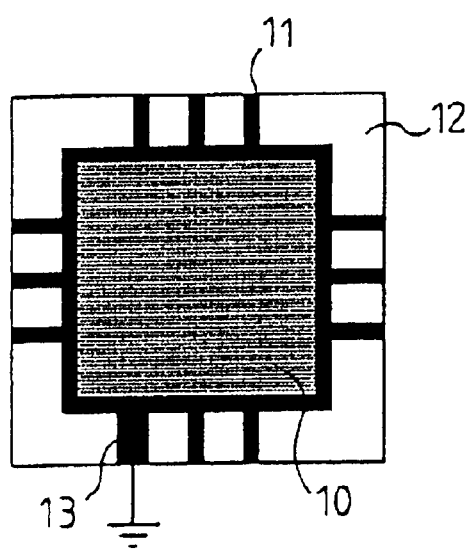
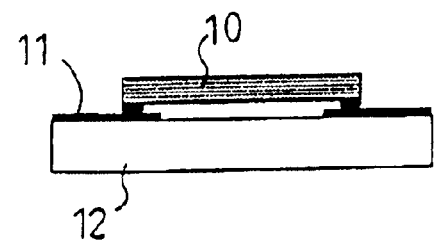
Fig. 1a
(Prior Art)
Fig. 1b
(Prior Art)

US 6,849,954 B2

IC PACKAGE SUBSTRATE WITH OVER VOLTAGE PROTECTION FUNCTION

FIELD OF THE INVENTION

The present invention relates to an IC package substrate with over voltage protection function, more particularly, to a single IC package substrate provided with a structure having multiple over voltage protection devices.

BACKGROUND OF THE INVENTION

A conventional over voltage protection device is installed on a printed circuit board to protect internal IC devices according to demands by each IC device. However, such design requires installing independent over voltage protection devices to prevent respective IC devices from damage by surge pulses.

Please refer to FIG. 1a, which is a top view of an IC device disposed on a conventional substrate. In FIG. 1a, there are a plurality of electrodes (11) and a grounding line (13) disposed on a substrate (12). Then, an IC device (10) is soldered to the plurality of electrodes and the grounding line. FIG. 1b is a sectional view of an IC device disposed on a conventional substrate. In FIG. 1b, we can understand the relationship among the constituent elements. Because such structure cannot provide a over voltage protection function, the IC device cannot accept the energy of surge pulses, resulting in an irrecoverable damage to the IC device.

In order to protect the IC device, several over voltage protection devices are subsequently proposed. However, those over voltage protection devices need to install individual protection devices on a printed circuit board according to the actual necessity after the IC device was manufactured and installed on the printed circuit board. Therefore, such design has the disadvantages of high design costs, wasting limited space, and providing incomplete protection to the IC device.

Therefore, there is a need to provide an IC package substrate with over voltage protection function. In this way, a plurality of over voltage protection devices are provided simultaneously to solve the problems in the prior arts that unable to provide the over voltage protection or the inconvenience in the prior arts that need to install individual protection devices on a printed circuit board. The present invention provides an IC package substrate with over voltage protection function to eliminate the inconvenience.

SUMMARY OF INVENTION

An object of the present invention is to provide an IC package substrate with over voltage protection function and thus, the IC device can be protected in the presence of surge pulses.

Another object of the present invention is to provide an IC package substrate with over voltage protection function and thus, the over voltage protection devices are installed on the substrate directly.

Still another object of the present invention is to enable the substrate to be equipped with a plurality of over voltage protection devices. Thus, the present invention can reduce design costs, save limited space and lower down the unit cost to install the protection device to the IC device.

A still further object of the present invention is to provide an IC package substrate with over voltage protection function, wherein the substrate can be designed in different IC packaging technologies, such as surface mounting technology and pin soldering technology.

In order to accomplish the above objects, the present invention provides an IC package substrate with over voltage protection function. The IC package substrate comprises a substrate (22); one or more lower electrodes disposed on the substrate; one or more protection material layers (24) disposed on the lower electrodes, and electrically connected with the lower electrodes; one or more upper electrodes (21) disposed on the one or more protection material layers and connected with said protection material layers; and one or more grounding lines (23).

In order to understand the technical contents and features of the present invention with ease, the present invention is described by referring to the accompanying drawings.

BRIEF DESCRIPTION OF THE DRAWINGS

The present invention will be illustrated according to the following drawings, wherein:

FIG. 1a shows a top view of an IC device disposed on a conventional substrate;

FIG. 1b shows a sectional view of an IC device disposed on a conventional substrate;

DETAILED DESCRIPTION OF THE PREFERRED EMBODIMENT

Figure 2A:
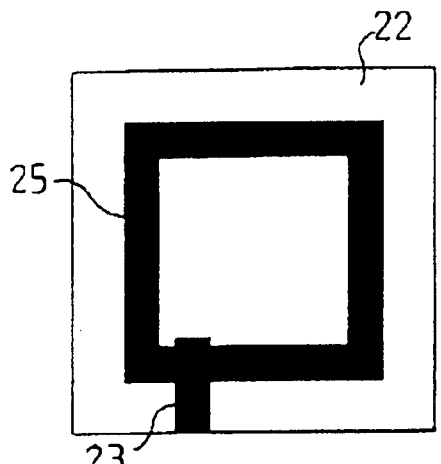
FIGS. 2a, 2c, 2e, 2g and 2i are a top view of an IC package substrate with over voltage protection function according to an embodiment of the present invention.

The embodiments of the present invention are described with reference to the drawings. The same elements in the drawing have the same reference numerals.

Figure 2B:
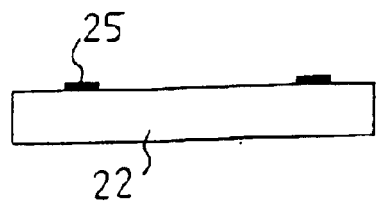
FIGS. 2b, 2d, 2f, 2h and 2j are a sectional view of an IC package substrate with over voltage protection function according to an embodiment of the present invention.

In FIGS. 2a and 2b, a lower electrode (25) is disposed on a substrate (22), wherein a grounding line (23) and the lower electrode (25) are connected. In another embodiment, the grounding line and the lower electrode can be separated.

Figure 2C:
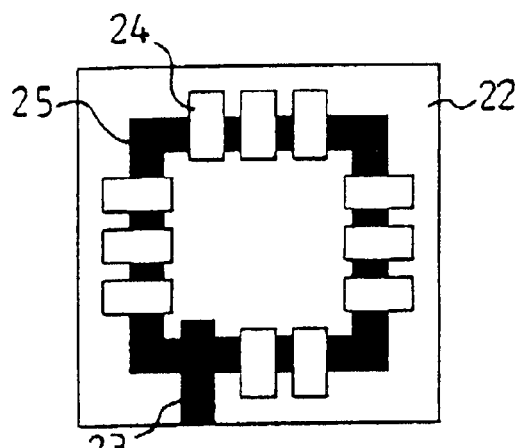
Figure 2D:
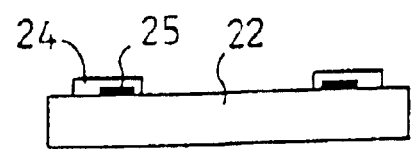
Figure 2E:
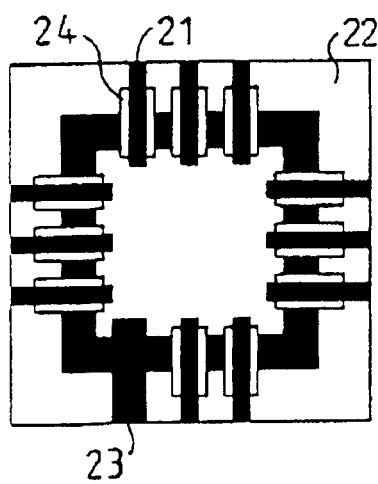
Figure 2F:
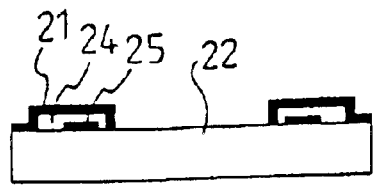

In FIGS. 2c and 2d, protection material layers (24) are disposed on the lower electrodes (25). In FIGS. 2e and 2f, one or more upper electrodes (21) are disposed on the protection material layers (24), wherein the protection material layers are variable resistance material layers.

Figure 2G:
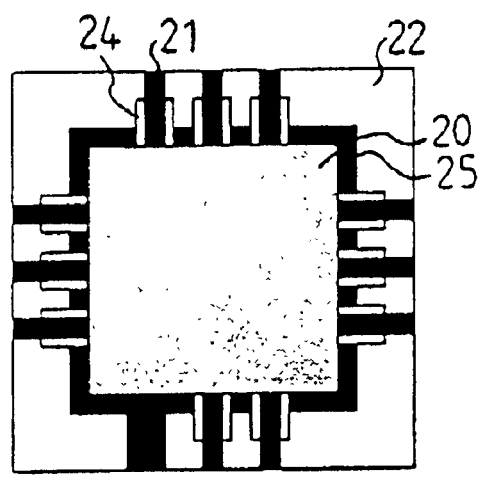
Figure 2H:
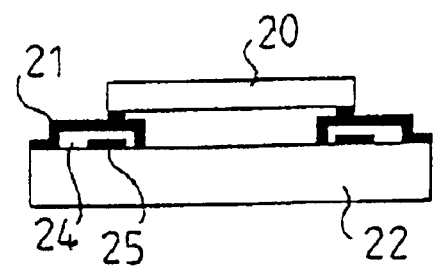

In FIGS. 2g and 2h, an IC chip (20) is installed on the substrate. The IC chip is a flip chip, and is connected with the upper electrodes (21) and the grounding line (23) by soldering. In another embodiment of the present invention, the chip (20) is connected with the upper electrodes (21) and the grounding line (23) by wire bonding.

Figure 2I:
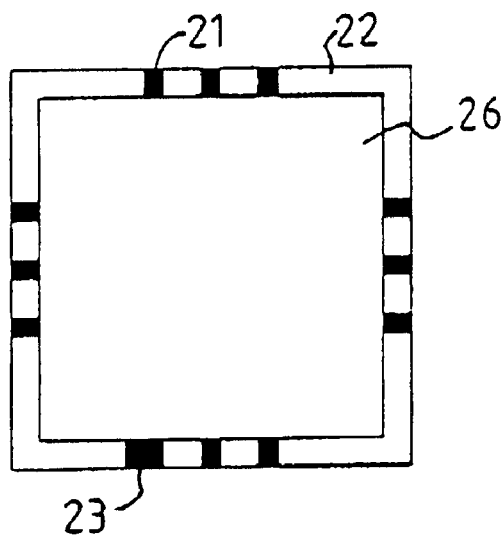
Figure 2J:
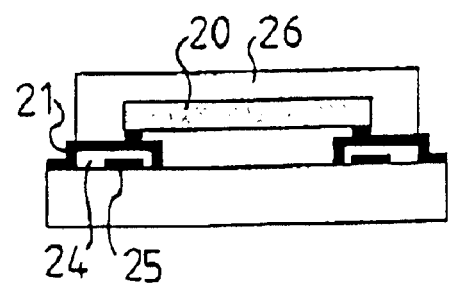

FIGS. 2i and 2j are schematic diagrams of the IC chip installed on the substrate. An overcoat (26) protects the IC chip (20) and helps the heat dissipation.

Figure 3A:
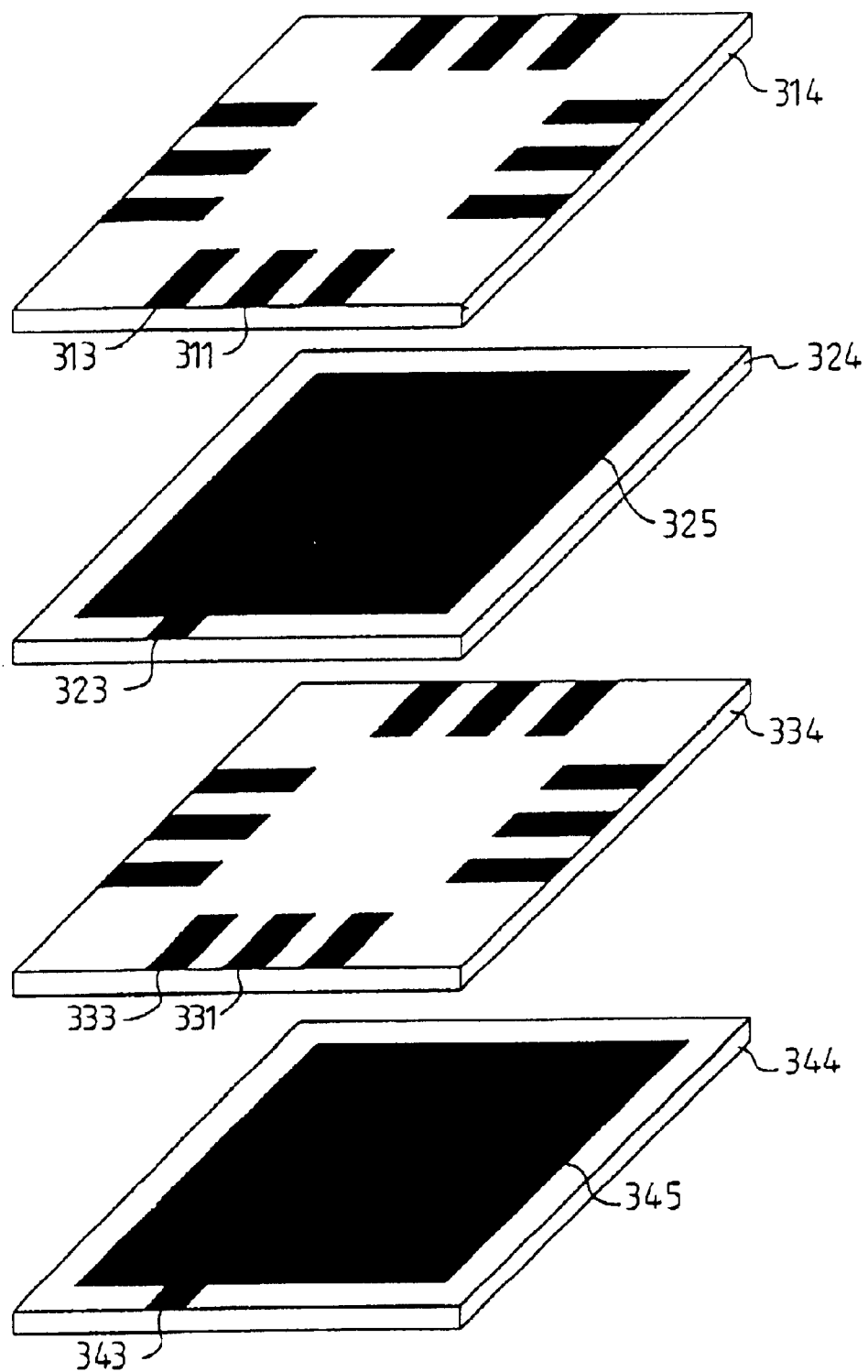
FIG. 3a is schematic diagram of an assembled IC package multi-layer substrate with over voltage protection function before the multiple layers are assembled to form the substrate according to another embodiment of the present invention.

Another embodiment of the present invention provides an IC package substrate with over voltage protection function by a multiplayer structure. With reference FIG. 3a, an IC package substrate with over voltage protection function has a four-layer structure, wherein a first layer is provided with a plurality of upper electrodes (311) and a grounding line (313) on a protection material layer (314). The protection material layer (314) is a variable resistance material layer. A third layer has the same structure as the first layer. Namely, a plurality of upper electrodes (331) and a grounding line (333) are disposed on a protection material layer (334). A second layer is provided with a lower electrode (325) and a grounding line (323) on a protection material layer (324). The protection material layer (324) is a variable resistance material layer. A fourth layer has the same structure as the second layer. Namely, a lower electrode (345) and a grounding line (343) are disposed on a protection material layer (344).

Figure 3B:
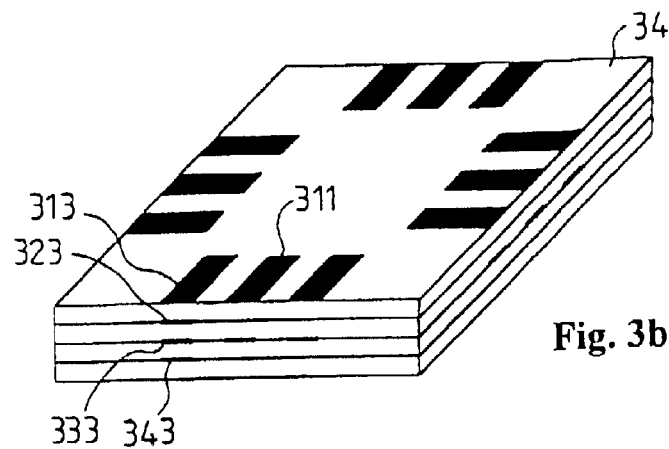
FIGS. 3b, 3c and 3d are schematic diagrams of IC package multi-layer substrate with over voltage protection function according to still another embodiment of the present invention.
Figure 3C:
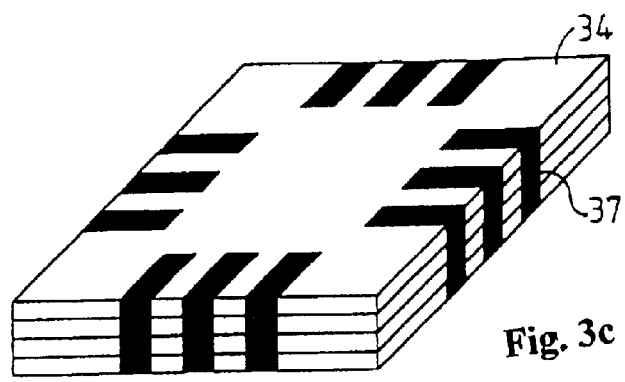
Figure 3D:
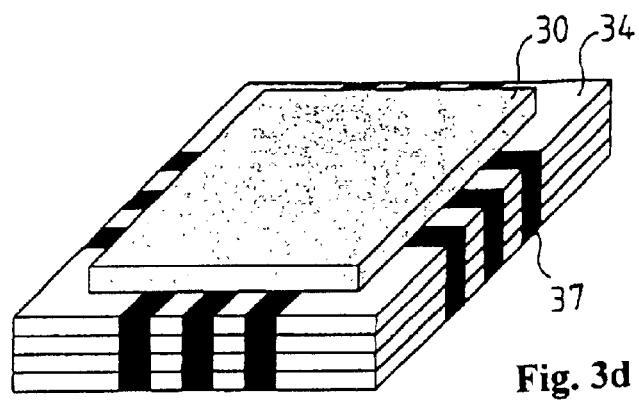
Figure 3E:
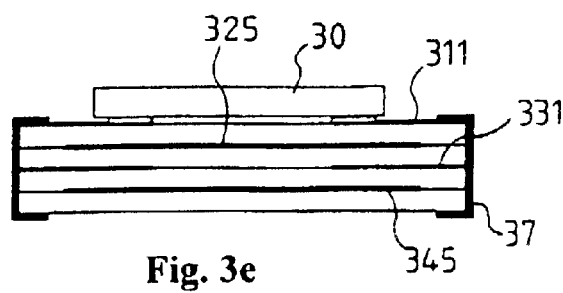
FIG. 3e is a sectional view of an IC package multi-layer substrate with over voltage protection function according to another embodiment of the present invention.

FIG. 3b is a schematic diagram showing an assembly of the first layer to the fourth layer. In FIG. 3b, physical relationships among the associated layers in the multi-layer structure are clearly shown. In FIG. 3c, a plurality of terminations (37) are electrically connected to the groundings lines (313, 323, 333, 343) in each layer. By the way, the upper electrodes (311, 331) on the first and third layers are also electrically connected by the terminations (37). FIG. 3d shows a flip chip (30) disposed on the top layer of the multi-layer structure, wherein the flip chip is electrically connected with the terminations. The electrical connection can be accomplished by soldering. In FIG. 3e, the connection relationships between the flip chip and the multi-layer protection material device are clearly shown. In another embodiment of the present invention, the chip can be electrically connected with the terminations by wire bonding.

When a surge pulse occurs, the energy of the surge pulse will enter into the electrodes via terminations and transmit to the grounding line through the multi-layer structure protection material layers. Because the features of the variable resistance materials and the multilayer structure, the energy of the surge pulse will be released evenly to the grounding lines of each layer and thus, the IC device will not be damaged and the object to protect the IC device is achieved.

Although the invention has been disclosed in terms of preferred embodiments, the disclosure is not intended to limit the invention. The invention still can be modified or varied by persons skilled in the art without departing from the scope and spirit of the invention which is determined by the claims below.

What is claimed is:

1. An IC package substrate with over voltage protection function, comprising:

a substrate (22);

one or more lower electrodes (25) disposed on the substrate;

one or more protection material layers (24) disposed on the lower electrode and electrically connected with the lower electrodes;

one or more upper electrodes (21) disposed on the one or more protection material layers and connected with said protection material layers; and one or more grounding lines (23).

2. The IC package substrate with over voltage protection function of claim 1, wherein the protection material layers are variable resistance materials.

3. The IC package substrate with over voltage protection function of claim 1, further comprising an overcoat (26) for protecting an IC chip and helping heat dissipation.

4. The IC package substrate with over voltage protection function of claim 1, wherein the grounding lines are separated from the lower electrodes.

* * * * *